(12) United States Patent
Fujitsuka et al.

(10) Patent No.: US 11,309,322 B2
(45) Date of Patent: Apr. 19, 2022

(54) SEMICONDUCTOR MEMORY DEVICE

(71) Applicant: KIOXIA CORPORATION, Minato-ku (JP)

(72) Inventors: Ryota Fujitsuka, Yokkaichi (JP); Kenta Yamada, Yokohama (JP); Takanori Yamanaka, Yokkaichi (JP); Takayuki Okada, Kuwana (JP); Hirokazu Ishigaki, Yokkaichi (JP); Hiroki Kishi, Yokkaichi (JP); Nobushi Matsuura, Yokkaichi (JP); Takashi Yamane, Yokkaichi (JP); Ryota Suzuki, Yokkaichi (JP)

(73) Assignee: KIOXIA CORPORATION, Minato-ku (JP)

( * ) Notice: Subject to any disclaimer, the term of this patent is extended or adjusted under 35 U.S.C. 154(b) by 0 days.

(21) Appl. No.: 16/569,215

(22) Filed: Sep. 12, 2019

(65) Prior Publication Data

US 2020/0303393 A1    Sep. 24, 2020

(30) Foreign Application Priority Data

Mar. 18, 2019  (JP) .............................. JP2019-050252

(51) Int. Cl.
*H01L 27/11563* (2017.01)
*H01L 21/02* (2006.01)
(Continued)

(52) U.S. Cl.
CPC .... *H01L 27/11563* (2013.01); *H01L 21/0217* (2013.01); *H01L 21/02211* (2013.01);
(Continued)

(58) Field of Classification Search
CPC ......... H01L 21/02211; H01L 21/76834; H01L 21/0217; H01L 21/11582; H01L 29/40117;
(Continued)

(56) References Cited

U.S. PATENT DOCUMENTS 7,807,557 B2   10/2010  Yoshida et al.
9,391,084 B2   7/2016   Lue
(Continued)

FOREIGN PATENT DOCUMENTS

JP    2007-305966 A    11/2007
JP    2008-53553 A     3/2008
(Continued)

*Primary Examiner* — Vongsavanh Sengdara
(74) *Attorney, Agent, or Firm* — Oblon, McClelland, Maier & Neustadt, L.L.P.

(57) ABSTRACT

A semiconductor memory device according to an embodiment includes a semiconductor substrate; a laminated body formed by laminating a plurality of electrode layers on the semiconductor substrate; a memory film provided in the laminated body and including a first block insulation film disposed in a direction perpendicular to the electrode layer, a charge storage film facing the first block insulation film, a tunnel insulation film facing the charge storage film, and a channel film facing the tunnel insulation film; and a barrier layer provided at at least one of interface between the plurality of electrode layers and the memory film and an interface in the memory film and mainly composed of carbon.

4 Claims, 7 Drawing Sheets

(51) Int. Cl.
*H01L 29/423* (2006.01)
*H01L 21/28* (2006.01)
*H01L 21/768* (2006.01)

(52) U.S. Cl.
CPC .. *H01L 21/76834* (2013.01); *H01L 29/40117* (2019.08); *H01L 29/42348* (2013.01); *H01L 29/42364* (2013.01)

(58) Field of Classification Search
CPC ........... H01L 29/42348; H01L 29/4234; H01L 29/42364; H01L 27/11565; H01L 27/11563; H01L 27/11582
See application file for complete search history.

(56) References Cited

U.S. PATENT DOCUMENTS

| | | | |
|---|---|---|---|
| 9,786,675 | B2 | 10/2017 | Jung et al. |
| 10,475,809 | B2 | 11/2019 | Ito et al. |
| 2007/0241390 | A1* | 10/2007 | Tanaka .............. H01L 27/11521 257/314 |
| 2009/0256192 | A1 | 10/2009 | Fujitsuka et al. |
| 2016/0372481 | A1* | 12/2016 | Izumida ............ H01L 27/11582 |
| 2017/0221976 | A1* | 8/2017 | Park .................... H01L 27/3246 |
| 2018/0166463 | A1* | 6/2018 | Cho ................. H01L 29/42332 |
| 2018/0351093 | A1 | 12/2018 | Wu et al. |
| 2020/0287007 | A1 | 9/2020 | Kasai |

FOREIGN PATENT DOCUMENTS

| | | |
|---|---|---|
| JP | 2009-253259 A | 10/2009 |
| TW | 201903975 A | 1/2019 |

* cited by examiner

SEMICONDUCTOR MEMORY DEVICE

CROSS-REFERENCE TO RELATED APPLICATIONS

This application is based upon and claims the benefit of priority from Japanese Patent Application No. 2019-050252, filed on Mar. 18, 2019; the entire contents of which are incorporated herein by reference.

FIELD

Embodiments of the present invention relate to a semiconductor memory device.

BACKGROUND

A three-dimensional laminated semiconductor memory device that is one of semiconductor memory devices includes a laminated body formed by laminating a plurality of electrode layers and a memory film provided in the laminated body. A plurality of types of films are provided in the memory film.

DETAILED DESCRIPTION

Embodiments will now be explained with reference to the accompanying drawings. The present invention is not limited to the embodiments.

A semiconductor memory device according to an embodiment includes: a semiconductor substrate; a laminated body formed by laminating a plurality of electrode layers on the semiconductor substrate; and a memory film provided in the laminated body and including a first block insulation film disposed in a direction perpendicular to the electrode layers, a charge storage film facing the first block insulation film, a tunnel insulation film facing the charge storage film, and a channel film facing the tunnel insulation film; and a barrier layer provided at at least one of an interface between a plurality of electrode layers and the memory film, and an interface in the memory film, and mainly composed of carbon.

First Embodiment

Figure 1:
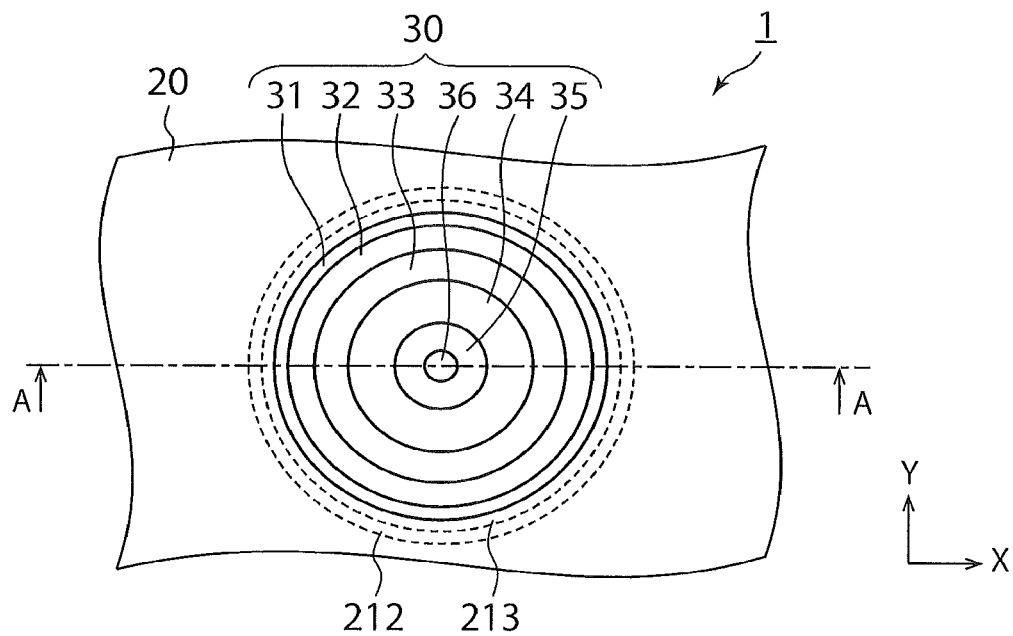
FIG. 1 is a plan view illustrating a configuration of essential parts of a semiconductor memory device according to a first embodiment.
Figure 2:
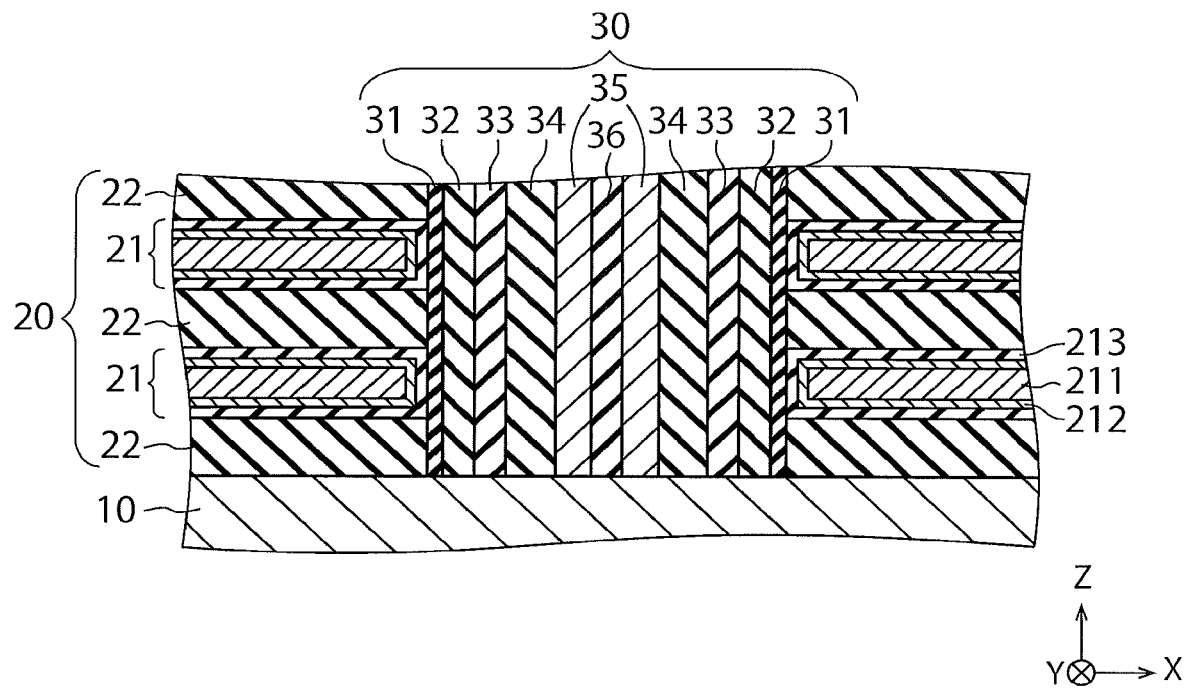
FIG. 2 is a cross-sectional view taken along a cutting line A-A illustrated in FIG. 1.

FIG. 1 is a plan view illustrating a configuration of essential parts of a semiconductor memory device according to a first embodiment. FIG. 2 is a cross-sectional view taken along a cutting line A-A illustrated in FIG. 1.

As illustrated in FIGS. 1 and 2, a semiconductor memory device 1 includes a semiconductor substrate 10, a laminated body 20, and a memory film 30. The semiconductor substrate 10 is, for example, a silicon substrate, but various circuit elements and wiring layers may be formed on the silicon substrate. The laminated body 20 is provided on the semiconductor substrate 10.

As illustrated in FIG. 2, the laminated body 20 includes a plurality of electrode layers 21 and a plurality of insulation layers 22. The plurality of electrode layers 21 and the plurality of insulation layers 22 are alternately laminated in a Z direction orthogonal to the semiconductor substrate 10.

Each electrode layer 21 includes a metal layer 211, a barrier metal layer 212, and a block insulation film 213 (second block insulation film). The metal layer 211 includes, for example, tungsten (W) and functions as a word line. The barrier metal layer 212 includes, for example, titanium nitride (TiN) and covers the metal layer 211. The barrier metal layer 212 can prevent diffusion of metal materials and impurities contained in the metal layer 211. The block insulation film 213 includes, for example, aluminum oxide ($Al_2O_3$) and covers the barrier metal layer 212.

Each insulation layer 22 includes, for example, silicon oxide ($SiO_2$) and insulates and separates each electrode layer 21.

As illustrated in FIG. 2, the memory film 30 is a columnar body extending in the Z direction inside the laminated body 20, and includes: a barrier layer 31, a block insulation film 32 (first block insulation film), a charge storage film 33, a tunnel insulation film 34, a channel film 35, and a core insulation film 36.

The barrier layer 31 contains carbon as a main component, and is provided at an interface between the block insulation film 213 of each electrode layer 21 and the block insulation film 32, and an interface between the insulation layer 22 and the block insulation film 32. The barrier layer 31 can suppress aluminum from diffusing from the block insulation film 213 into the block insulation film 32 (for example, a silicon oxide film) and thereby can suppress deterioration of insulation of the block insulation film 32.

Since a band gap of the block insulation film 32 is wider than the band gap of the charge storage film 33, electrons accumulated in the charge storage film 33 normally do not leak out into the electrode layer 21. However, if the insulation of the block insulation film 32 deteriorates, the electrons may leak out into the electrode layer 21 through the deteriorated portion of the block insulation film 32.

Meanwhile, in the present embodiment, as described above, the barrier layer 31 can suppress deterioration of the block insulation film 32. As a result, electrons can be prevented from leaking out of the charge storage film 33 during data retention. Note that the barrier layer 31 may contain not only carbon but also silicon, nitrogen, and oxygen.

If the barrier layer 31 has too high a carbon concentration, insulation is unlikely to be secured. Therefore, it is desirable that the carbon concentration is within the range of 0.1 to 10.0 atomic %. Further, in order to secure the above insulation, it is desirable that the barrier layer 31 has a thickness equal to or less than 0.5 nanometers.

The block insulation film 32 includes, for example, silicon oxide and faces an inner peripheral surface of the barrier layer 31. The charge storage film 33 includes, for example, silicon nitride (SiN) and faces an inner peripheral surface of the block insulation film 32. The tunnel insulation film 34 includes, for example, silicon oxynitride (SiON) and faces an inner peripheral surface of the charge storage film 33. The channel film 35 includes, for example, polysilicon and faces an inner peripheral surface of the tunnel insulation film 34. The channel film 35 is connected to a bit line (unillustrated) provided on the memory film 30. The core insulation film 36 includes, for example, silicon oxide and faces an inner peripheral surface of the channel film 35.

Hereinafter, with reference to FIGS. 3 to 6, a part of the manufacturing process of the above described semiconductor memory device 1 will be described.

Figure 3:
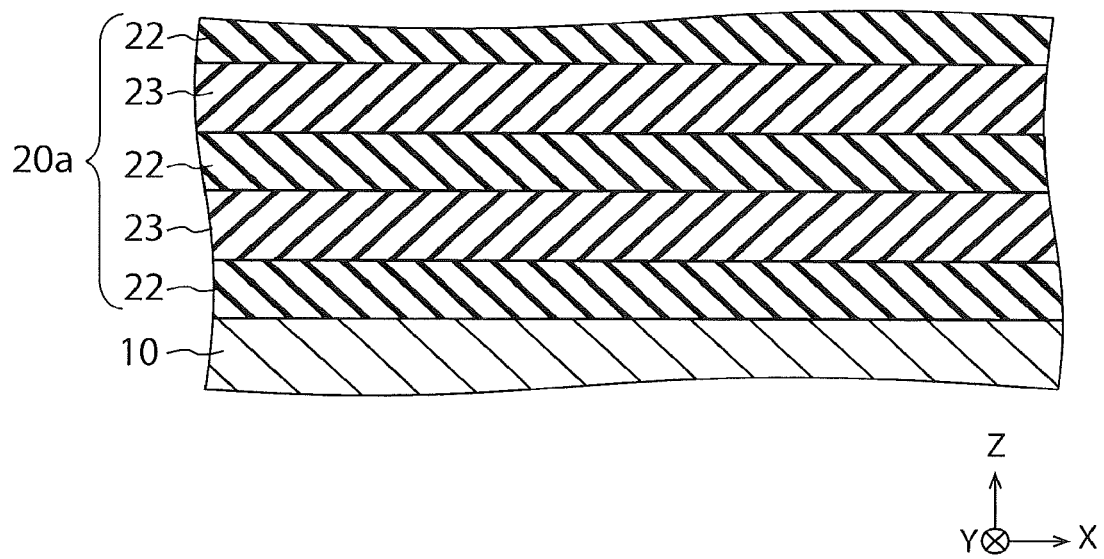
FIG. 3 is a cross-sectional view for describing a process of forming a laminated body.

First, as shown in FIG. 3, a laminated body 20a is formed on the semiconductor substrate 10. The laminated body 20a is formed by alternately laminating the insulation layer 22 and the insulation layer 23 in the Z direction. The insulation layer 22 and the insulation layer 23 can be formed by, for example, CVD (Chemical Vapor Deposition) or ALD (Atomic Layer Deposition). The insulation layer 23 is, for example, a silicon nitride layer.

Figure 4:
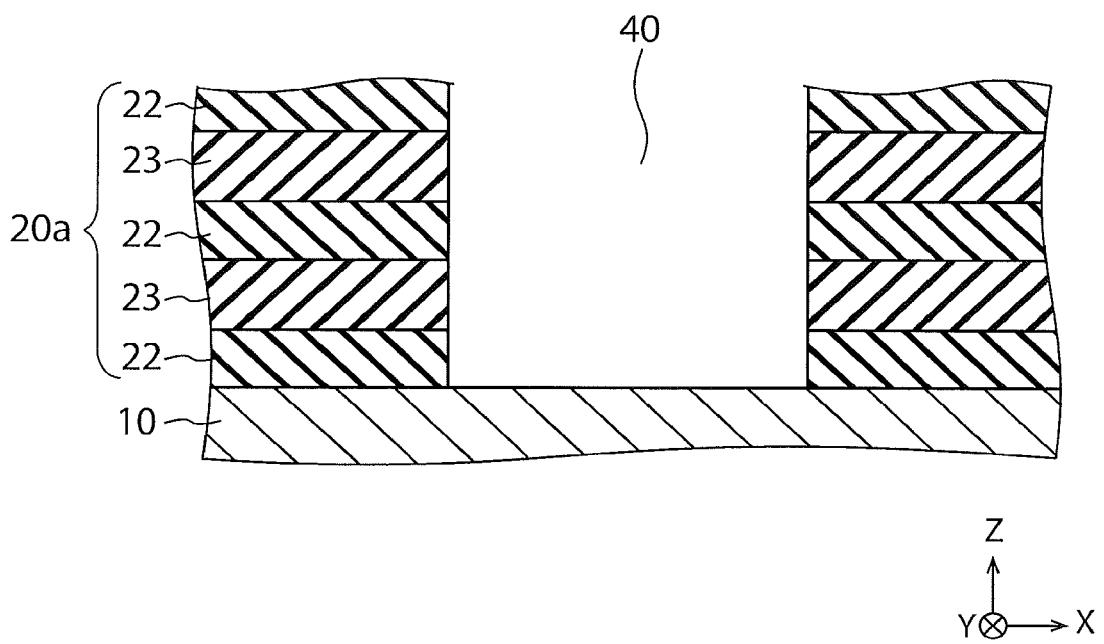
FIG. 4 is a cross-sectional view for describing a process of forming a hole.

Then, as illustrated in FIG. 4, a hole 40 is formed to penetrate through the laminated body 20a in the Z direction. The hole 40 is provided at a position where the memory film 30 is to be formed, for example, by RIE (Reactive Ion Etching). Note that in the present embodiment, a plurality of holes 40 each are formed in an X direction and in a Y direction orthogonal to the Z direction.

Figure 5:
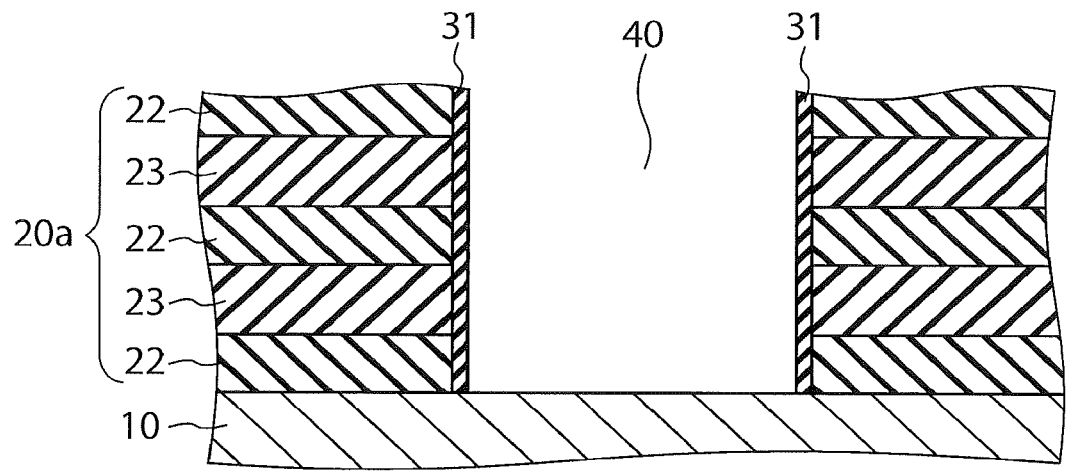
FIG. 5 is a cross-sectional view for describing a process of forming a barrier layer.

Then, as illustrated in FIG. 5, the barrier layer 31 is formed on an inner side surface of the hole 40. The barrier layer 31 can be formed, for example, by ALD that alternately supplies a silicon-containing gas such as hexachlorodisilane and dichlorosilane and an alkylamine-containing gas as exemplified by trimethylamine, diethylamine, triethylamine, and ethylenediamine. Ammonia may be used to control the nitrogen concentration of the barrier layer 31. Further, oxygen, ozone, nitrous oxide, or the like may be used to control the oxygen concentration of the barrier layer 31. The barrier layer 31 having a desired film composition can be formed by adjusting the supply ratio of a silicon-containing gas, alkylamine, ammonia, and an oxidizing gas.

Figure 6:
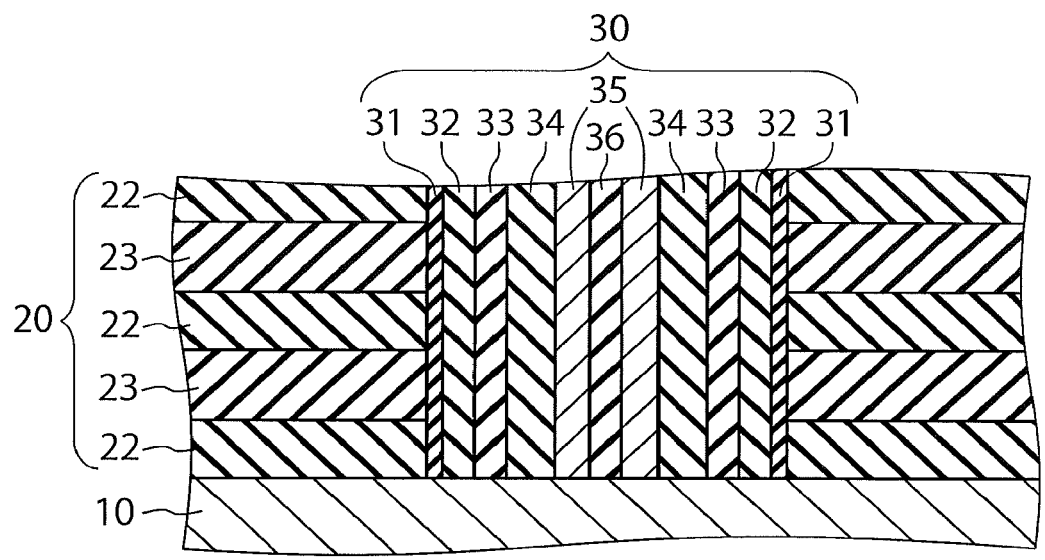
FIG. 6 is a cross-sectional view for describing a process of forming a memory film.

Then, as illustrated in FIG. 6, the block insulation film 32, the charge storage film 33, the tunnel insulation film 34, the channel film 35, and the core insulation film 36 are sequentially formed thereby to complete the memory film 30. Since a commonly-used film-forming method such as ALD can be used to form the block insulation film 32 up to the core insulation film 36, the related description will be omitted herein.

Then, the insulation layer 23 is removed by wet etching using a phosphoric acid solution or the like. Subsequently, the block insulation film 213 (aluminum oxide) and the electrode layer 21 are formed at a position where the insulation layer 23 is removed. In this manner, the insulation layer 23 is replaced with the electrode layer 21 to form the laminated body 20 as illustrated in FIG. 2.

According to the present embodiment described so far, the barrier layer 31 mainly composed of carbon is formed at an interface between the block insulation film 213 of the electrode layer 21 and the block insulation film 32. Thus, the present embodiment can suppress aluminum from diffusing from the block insulation film 213 into the block insulation film 32 (for example, a silicon oxide film) due to heat treatment or the like in the subsequent manufacturing process and thereby can suppress deterioration of insulation of the block insulation film 32. As a result, the electrons accumulated in the charge storage film 33 can be suppressed from leaking out into the electrode layer 21. Therefore, the present embodiment can improve the reliability of the data retention capability of the nonvolatile semiconductor memory device.

First Modification

Figure 7:
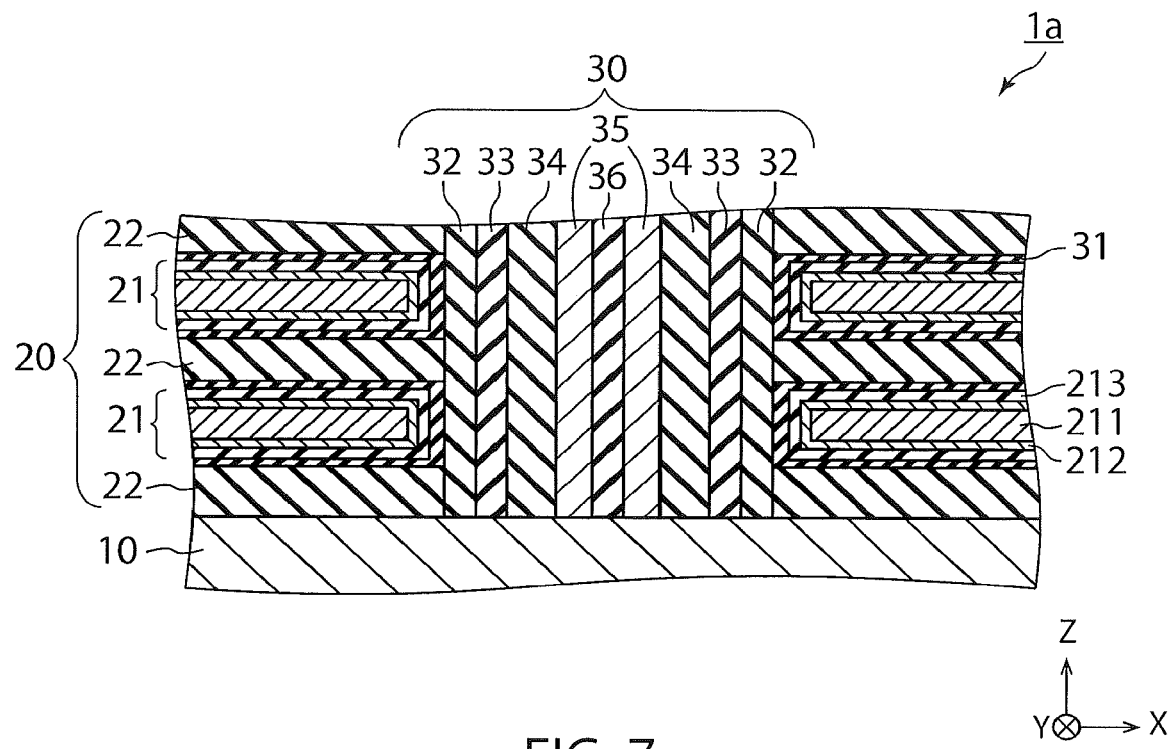
FIG. 7 is a cross-sectional view illustrating a configuration of essential parts of a semiconductor memory device according to a first modification.

FIG. 7 is a cross-sectional view illustrating a configuration of essential parts of a semiconductor memory device according to a first modification. The same components as those in the first embodiment described above are denoted by the same reference numerals or characters, and detailed description thereof is omitted.

In the semiconductor memory device 1 according to the first embodiment described above, the barrier layer 31 is provided in the memory film 30. Meanwhile, in the semiconductor memory device 1a according to the present modification, the barrier layer 31 is provided in the laminated body 20. Specifically, the barrier layer 31 is provided so as to cover the block insulation film 213 of the electrode layer 21. After the insulation layer 23 described in the first embodiment is removed, the barrier layer 31 is formed before the electrode layer 21 is formed.

Also in the present modification, as in the first embodiment, the barrier layer 31 is interposed at an interface between the block insulation film 32 and the block insulation film 213. Thus, the present modification can suppress aluminum from diffusing into the block insulation film 32, and as a result, can secure sufficient data retention characteristics. Further, in the present modification, the barrier layer 31 is also interposed between upper and lower adjacent electrode layers 21, and thus the present modification can improve the insulation of the insulation layer 22, and as a result, can improve the electrical stress resistance between adjacent word lines.

Second Embodiment

Figure 8:
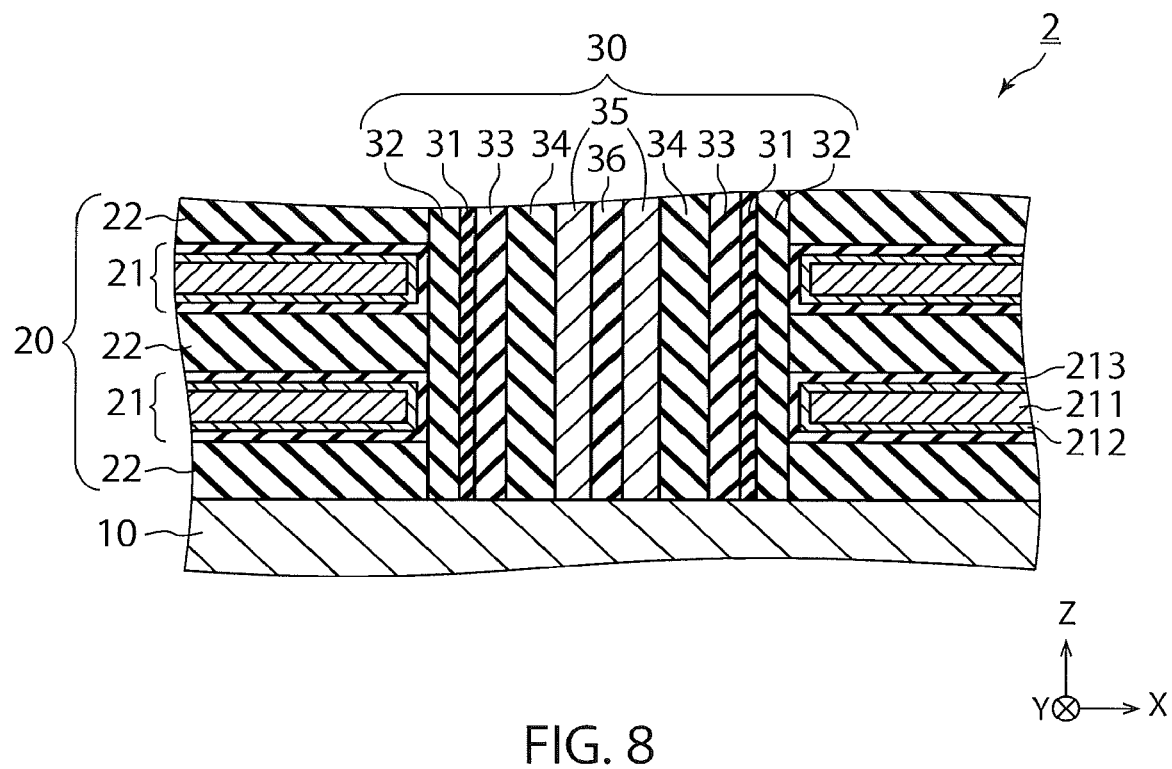
FIG. 8 is a cross-sectional view illustrating a configuration of essential parts of a semiconductor memory device according to a second embodiment.

FIG. 8 is a cross-sectional view illustrating a configuration of essential parts of a semiconductor memory device according to a second embodiment. The same components as those in the first embodiment described above are denoted by the same reference numerals or characters, and detailed description thereof is omitted.

In the semiconductor memory device 1 according to the first embodiment described above, the barrier layer 31 is provided on an outermost side of the memory film 30. Meanwhile, in the semiconductor memory device 2 according to the present embodiment, as illustrated in FIG. 8, the block insulation film 32 is provided on an outermost side of the memory film 30, and the barrier layer 31 is provided at an interface between the block insulation film 32 and the charge storage film 33.

In the present embodiment, after the block insulation film 32 is formed, the barrier layer 31 can be formed before the charge storage film 33 is formed by ALD in the same manner as in the first embodiment. Here, in order to cause the barrier layer 31 to function as a part of the charge storage layer at an interface between the block insulation film 32 and the charge storage film 33, it is desirable that the concentration of the carbon contained in the barrier layer 31 is within the range of 10.0 to 70.0 atomic %. Further, it is desirable that the oxygen concentration is as low as 1.0 atomic % or less. Therefore, it is desirable that the barrier layer 31 is formed, for example, by ALD that alternately supplies a silicon-containing gas such as hexachlorodisilane and dichlorosilane and an alkylamine-containing gas as exemplified by trimethylamine, diethylamine, triethylamine, ethylenediamine. Further, it is desirable that the thickness of the barrier layer 31 is equal to or greater than 0.3 nanometers and equal to or less than 1 nanometer.

The present embodiment can suppress interdiffusion of nitrogen and oxygen at an interface between the block insulation film 32 and the charge storage film 33 by the barrier layer 31. The nitrogen diffused in the block insulation film 32 may deteriorate the insulation of the block insulation film 32. Further, when the oxygen diffused in the charge storage film 33 forms a charge trapping site of a shallow energy level, the data retention characteristics of the memory cell may deteriorate.

However, the present embodiment can suppress the interfacial reaction between the block insulation film 32 and the charge storage film 33, thereby to improve the reliability of the data retention capability of the nonvolatile semiconductor memory device. Further, the barrier layer 31 containing a high concentration of carbon has a high charge trap density, and thus can reduce electrical stress on a memory cell in a write operation. As a result, the present embodiment can reduce electrical damage to the tunnel insulation film 34 and the block insulation film 32 due to a rewrite operation and can improve the reliability of the memory cell.

Third Embodiment

Figure 9:
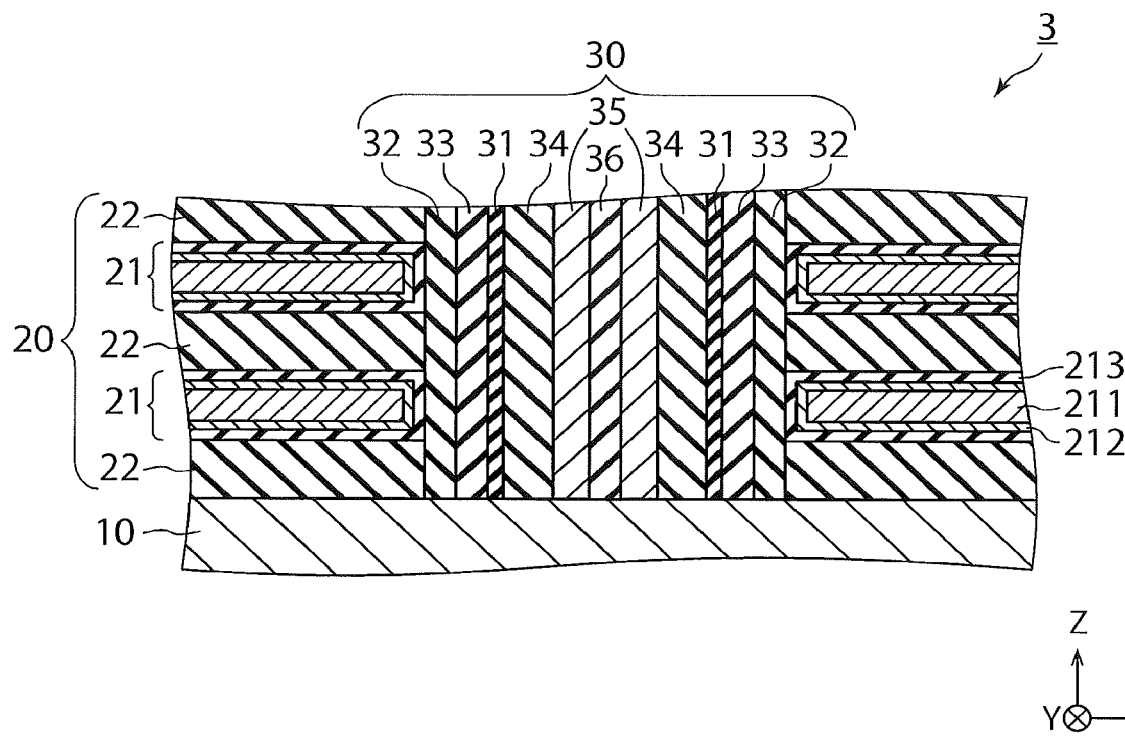
FIG. 9 is a cross-sectional view illustrating a configuration of essential parts of a semiconductor memory device according to a third embodiment.

FIG. 9 is a cross-sectional view illustrating a configuration of essential parts of a semiconductor memory device according to a third embodiment. The same components as those in the first embodiment described above are denoted by the same reference numerals or characters, and detailed description thereof is omitted.

In the semiconductor memory device 1 according to the first embodiment described above, the barrier layer 31 is provided on an outermost side of the memory film 30. Meanwhile, in a semiconductor memory device 3 according to the present embodiment, the barrier layer 31 is provided at an interface between the charge storage film 33 and the tunnel insulation film 34.

In the present embodiment, after the charge storage film 33 is formed, the barrier layer 31 can be formed before the tunnel insulation film 34 is formed by ALD in the same manner as in the first embodiment. Further, in order to cause the barrier layer 31 to function as an insulation film at an interface between the charge storage film 33 and tunnel insulation film 34, it is desirable that the concentration of the carbon contained in the barrier layer 31 is within the range of 1.0 to 50.0 atomic %. Therefore, it is desirable that the barrier layer 31 is formed, for example, by ALD that alternately supplies a silicon-containing gas such as hexachlorodisilane and dichlorosilane; an alkylamine-containing gas as exemplified by trimethylamine, diethylamine, triethylamine, ethylenediamine; and ammonia. Further, it is desirable that the thickness of the barrier layer 31 is equal to or less than 0.5 nanometers as in the first embodiment.

The present embodiment can suppress interdiffusion of nitrogen and oxygen at an interface between the charge storage film 33 and the tunnel insulation film 34 by the barrier layer 31. The nitrogen diffused in the tunnel film deteriorates the insulation of the tunnel film, and further, the oxygen diffused in the charge storage film forms a charge trapping site of a shallow energy level, which deteriorates the data retention characteristics of the memory cell. The present embodiment can suppress the interfacial reaction between the charge storage film 33 and the tunnel insulation film 34, thereby to improve the reliability of the data retention capability of the nonvolatile semiconductor memory device.

Fourth Embodiment

Figure 10:
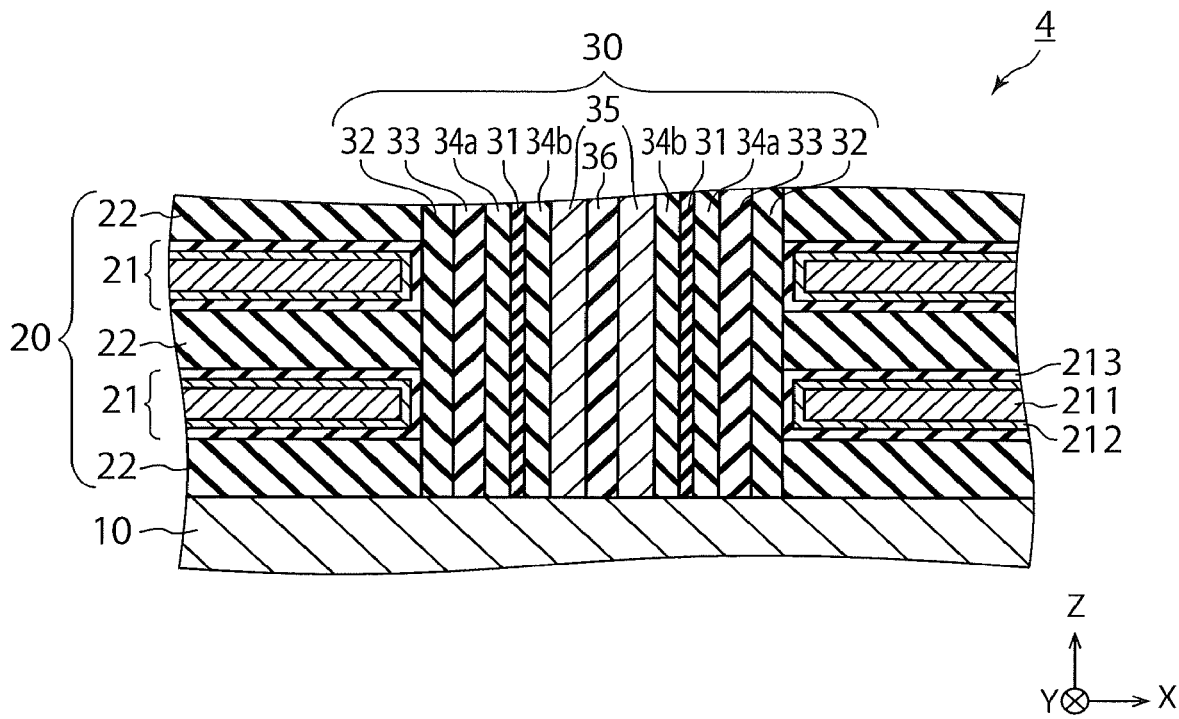
FIG. 10 is a cross-sectional view illustrating a configuration of essential parts of a semiconductor memory device according to a fourth embodiment.

FIG. 10 is a cross-sectional view illustrating a configuration of essential parts of a semiconductor memory device according to a fourth embodiment. The same components as those in the first embodiment described above are denoted by the same reference numerals or characters, and detailed description thereof is omitted.

As illustrated in FIG. 10, in the semiconductor memory device 4 according to the present embodiment, the tunnel insulation film includes a first film 34a facing the charge storage film 33 and a second film 34b facing the channel film 35. The barrier layer 31 is provided at an interface between the first film 34a and the second film 34b.

Both the first film 34a and the second film 34b are a silicon oxynitride film. Note that the oxygen concentration of the second film 34b is higher than the oxygen concentration of the first film 34a. Meanwhile, the nitrogen concentration of the second film 34b is lower than the nitrogen concentration of the first film 34a.

In the present embodiment, after the first film 34 is formed, the barrier layer 31 can be formed before the second film 34b is formed by ALD in the same manner as in the first embodiment. Further, in order to secure the insulation of the tunnel insulation film 34, it is desirable that the concentration of the carbon contained in the barrier layer 31 is within the range of 0.1 to 10.0 atomic %. Therefore, it is desirable that the barrier layer 31 is formed, for example, by ALD that alternately supplies a silicon-containing gas such as hexachlorodisilane and dichlorosilane; an alkylamine-containing gas as exemplified by trimethylamine, diethylamine, triethylamine, ethylenediamine; ammonia; and an oxidizing gas such as oxygen, ozone, and nitrous oxide. Further, it is desirable that the thickness of the barrier layer 31 is equal to or less than 0.5 nanometers as in the first embodiment.

The present embodiment can suppress interdiffusion of nitrogen and oxygen between the first film 34a and the second film 34b by the barrier layer 31 in the tunnel insulation film. The nitrogen diffused in the second film 34b deteriorates the insulation of the tunnel film, and further, the oxygen diffused in the first film 34a causes an increase in write/erase operation voltage. In the memory film of the three-dimensional laminated semiconductor memory device, with the progress of miniaturization, interdiffusion or distortion of materials occurs at an interface between different types of films, which may cause deterioration in reliability such as leakage of captured electrons and deterioration of rewrite operation resistance. In view of such a problem, the present embodiment can improve the reliability of the data retention capability of the nonvolatile semiconductor memory device and improve the resistance to electrical stress such as a rewrite operation.

Note that in the above described embodiments and modification, the barrier layer 31 is provided at one of an interface between the electrode layer 21 and the memory film 30, and an interface in the memory film 30, but may be provided on both interfaces. Note also that the laminated configuration of the memory film 30 is not limited to the above-described embodiments and modification. For example, the charge storage film 33 is formed of a plurality of layers, and the barrier layer 31 may be provided at an interface between the layers. In other words, the barrier layer 31 may be provided at at least one of an interface between the electrode layer 21 and the memory film 30 and an interface in the memory film 30.

Fifth Embodiment

Figure 11:
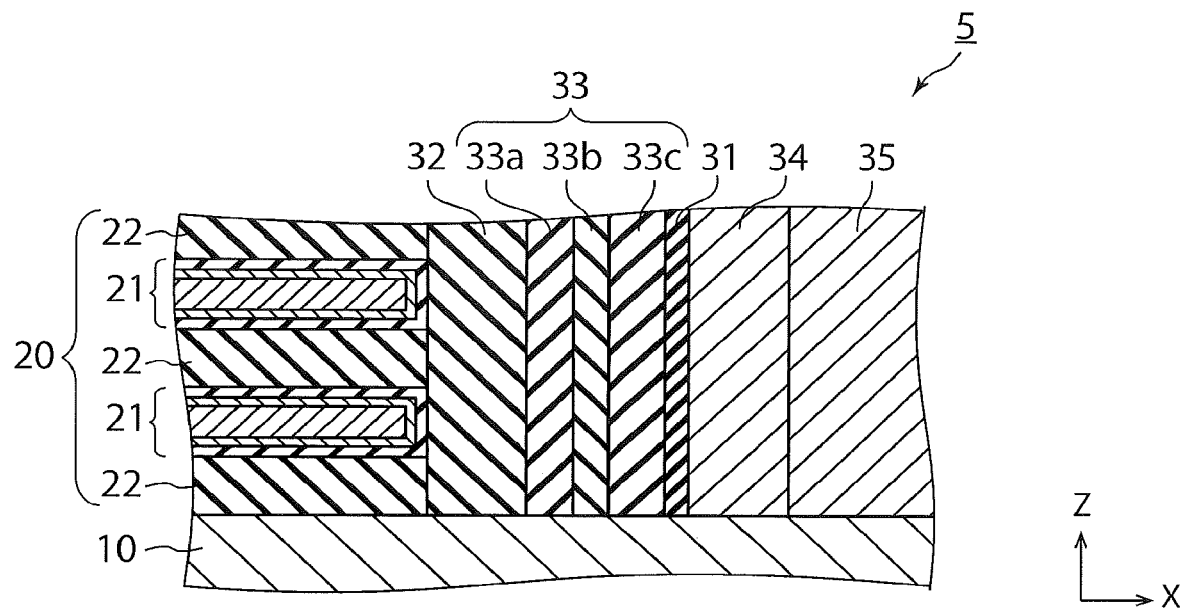
FIG. 11 is a cross-sectional view illustrating a configuration of essential parts of a semiconductor memory device according to a fifth embodiment.

FIG. 11 is a cross-sectional view illustrating a configuration of essential parts of a semiconductor memory device according to a fifth embodiment. The same components as those in the first embodiment described above are denoted by the same reference numerals or characters, and detailed description thereof is omitted.

As illustrated in FIG. 11, in the semiconductor memory device 5 according to the present embodiment, the charge storage film 33 has a three-layer structure of a layer 33a, a layer 33b, and a layer 33c. The layer 33a faces the block insulation film 32. The layer 33b faces the layer 33a. The layer 33c faces the layer 33b. The barrier layer 31 is provided at an interface between the layer 33c and the tunnel insulation film 34. The barrier layer 31 includes, for example, silicon carbon nitride (SiCN).

The composition of the layer 33a, the layer 33b, and the layer 33c, is for example, a silicon nitride layer, a silicon oxynitride layer, and a silicon nitride layer. The layer 33b may be a silicon oxide layer. Further, the silicon content of the layer 33a may be greater or less than the silicon content of the layer 33c.

Further, every composition of the layer 33a, the layer 33b, and the layer 33c may be a silicon oxynitride layer. In the case of this composition, the oxygen content of the layer 33b is greater than the oxygen content of each of the layer 33a and the layer 33c.

When the charge storage film 33 is formed of a single layer of silicon nitride, electrons easily drift, leading to insufficient charge retention characteristics.

However, in the charge storage film 33 according to the above described present embodiment, a silicon oxynitride layer or a silicon oxide layer is formed as the layer 33b between the silicon nitride layers. The layer 33b suppresses movement of electrons accumulated in the charge storage film 33. Thus, the present embodiment can improve the charge retention characteristics.

Sixth Embodiment

Figure 12:
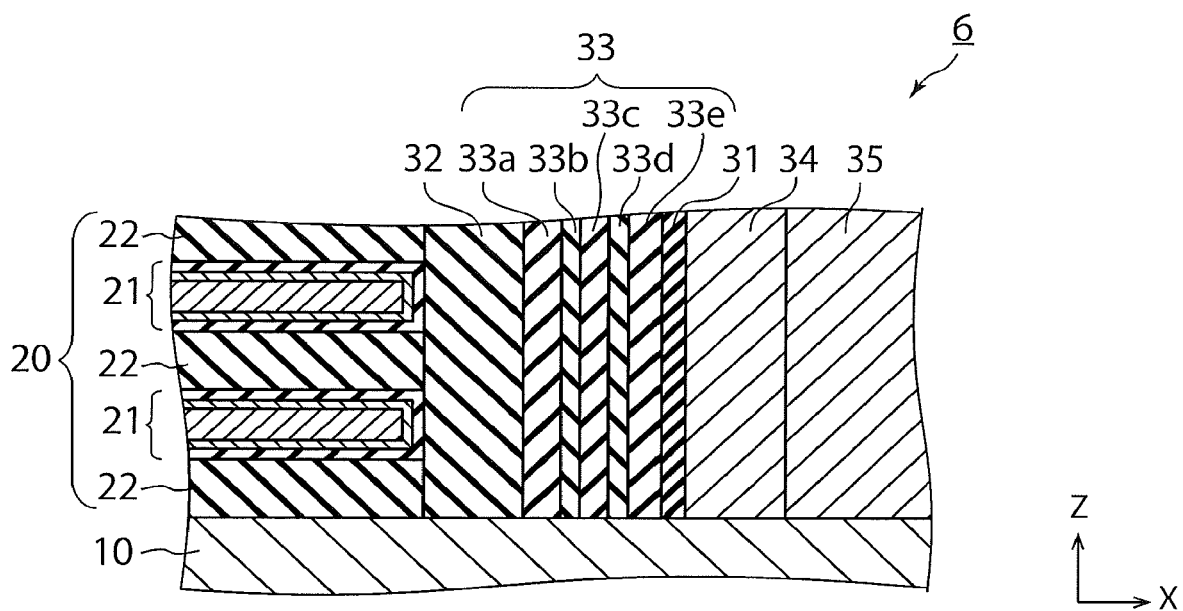
FIG. 12 is a cross-sectional view illustrating a configuration of essential parts of a semiconductor memory device according to a sixth embodiment.

FIG. 12 is a cross-sectional view illustrating a configuration of essential parts of a semiconductor memory device according to a sixth embodiment. The same components as those in the first embodiment described above are denoted by the same reference numerals or characters, and detailed description thereof is omitted.

As illustrated in FIG. 12, in the semiconductor memory device 6 according to the present embodiment, the charge storage film 33 has a five-layer structure of a layer 33a, a layer 33b, a layer 33c, a layer 33d, and a layer 33e. The layer 33a faces the block insulation film 32. The layer 33b faces the layer 33a. The layer 33c faces the layer 33b. The layer 33d faces the layer 33c. The layer 33e faces the layer 33d. The barrier layer 31 is provided at an interface between the layer 33e and the tunnel insulation film 34. The barrier layer 31 includes, for example, silicon carbon nitride (SiCN).

The composition of the layer 33a to the layer 33e is for example, a silicon nitride layer, a silicon oxynitride layer, a silicon nitride layer, a silicon oxynitride layer, and a silicon nitride layer. The layer 33b and the layer 33d may be a silicon oxide layer. Further, the silicon content of the layer 33a may be greater or less than the silicon content of the layer 33e.

Further, every composition of the layer 33a to the layer 33e may be a silicon oxynitride layer. In the case of this composition, the oxygen content of the layer 33b is greater than the oxygen content of each of the layer 33a and the layer 33c, and the oxygen content of the layer 33d is greater than the oxygen content of each of the layer 33c and the layer 33e.

According to the present embodiment described so far, a plurality of silicon oxynitride layers or a plurality of silicon oxide layers are formed as the layer 33b and the layer 33d between the silicon nitride layers. Therefore, the present embodiment further suppresses movement of electrons accumulated in the charge storage film 33 than the above described fifth embodiment. Thus, the present embodiment can further improve the charge retention characteristics.

Seventh Embodiment

Figure 13:
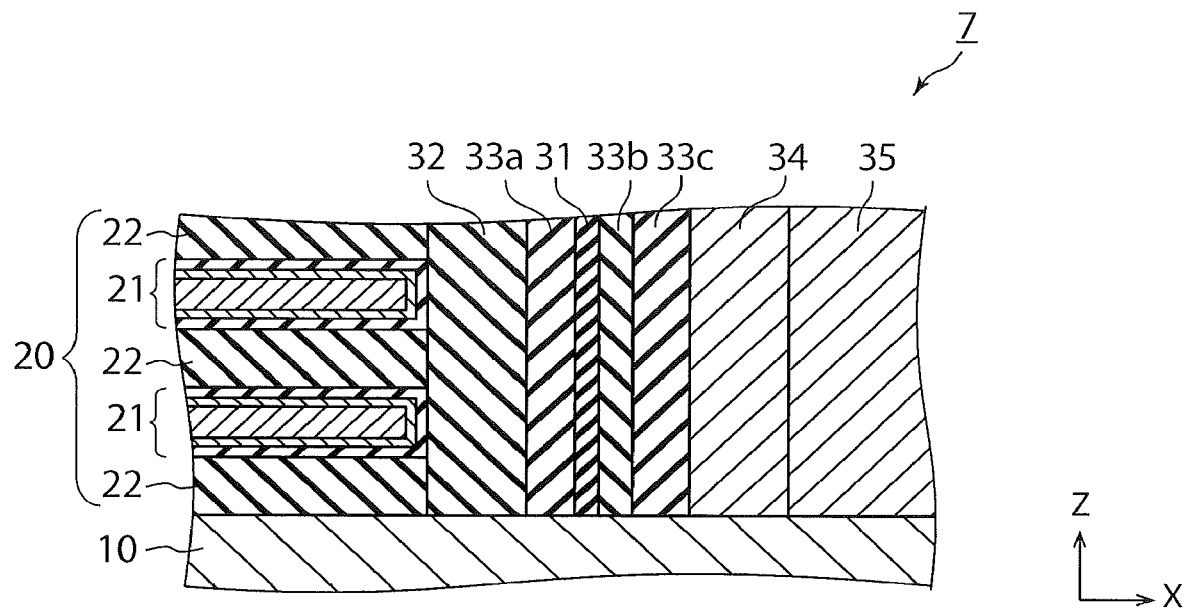
FIG. 13 is a cross-sectional view illustrating a configuration of essential parts of a semiconductor memory device according to a seventh embodiment.

FIG. 13 is a cross-sectional view illustrating a configuration of essential parts of a semiconductor memory device according to a seventh embodiment. The same components as those in the first embodiment described above are denoted by the same reference numerals or characters, and detailed description thereof is omitted.

As illustrated in FIG. 13, in the semiconductor memory device 7 according to the present embodiment, as in the above described fifth embodiment, the charge storage film has a three-layer structure of a layer 33a, a layer 33b, and a layer 33c. Note that in the present embodiment, the barrier layer 31 is provided at an interface between the layer 33a and the layer 33b. The barrier layer 31 includes, for example, silicon carbon nitride (SiCN).

When the layer 33a contains nitrogen and the layer 33b contains oxygen, there is a concern about the interdiffusion of nitrogen and oxygen. However, in the present embodiment, the layer 33a and the layer 33b are separated by the barrier layer 31 mainly composed of carbon. This suppresses the interfacial reaction between the layer 33a and the layer 33b and thus can suppress the interdiffusion of nitrogen and oxygen. As a result, the present embodiment can improve the reliability of the data retention capability of the nonvolatile semiconductor memory device.

Eighth Embodiment

Figure 14:
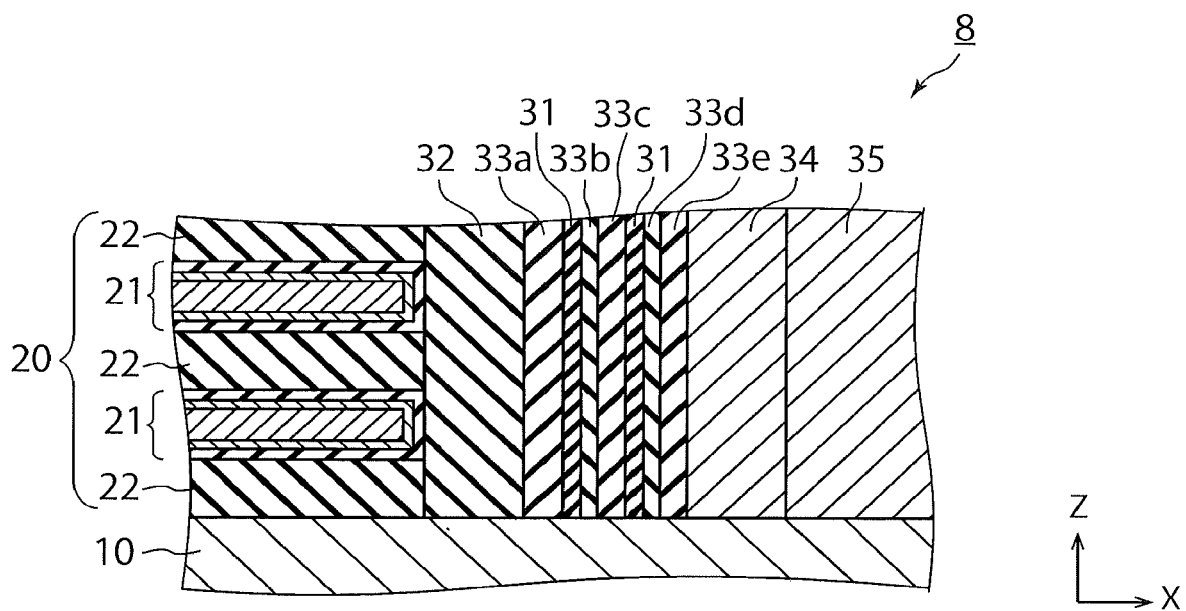
FIG. 14 is a cross-sectional view illustrating a configuration of essential parts of a semiconductor memory device according to an eighth embodiment.

FIG. 14 is a cross-sectional view illustrating a configuration of essential parts of a semiconductor memory device according to an eighth embodiment. The same components as those in the first embodiment described above are denoted by the same reference numerals or characters, and detailed description thereof is omitted.

As illustrated in FIG. 14, in the semiconductor memory device 8 according to the present embodiment, as in the above described sixth embodiment, the charge storage film has a five-layer structure of the layer 33a to the layer 33e. Note that in the present embodiment, the barrier layer 31 is provided at an interface between the layer 33a and the layer 33b, and at an interface between the layer 33c and the layer 33d. The barrier layer 31 includes, for example, silicon carbon nitride (SiCN).

In the present embodiment, the layer 33a containing nitrogen and the layer 33b containing oxygen are separated by the barrier layer 31 mainly composed of carbon. Further, the layer 33c containing nitrogen and the layer 33d containing oxygen are also separated by the barrier layer 31. This can suppress the interdiffusion of nitrogen and oxygen and thus can improve the reliability of the data retention capability of the nonvolatile semiconductor memory device. Note that the barrier layer 31 may be provided at one of the interface between the layer 33a and the layer 33b and the interface between the layer 33c and the layer 33d.

The present invention is not limited to these embodiments, but the barrier layer may be provided at any one of the interfaces between the layers in the memory cell film having a plurality of charge storage layers.

APPENDIX

A method of manufacturing a semiconductor device according to an embodiment comprises:

forming a laminated body formed by laminating a plurality of electrode layers on a semiconductor substrate;

forming a memory film provided in the laminated body and including a first block insulation film disposed in a direction perpendicular to the electrode layers, a charge storage film facing the first block insulation film, a tunnel insulation film facing the charge storage film, and a channel film facing the tunnel insulation film; and forming a barrier layer mainly composed of carbon at an interface between the plurality of electrode layers and the memory film, or an interface in the memory film.

The above manufacturing method may be configured such that in each of the plurality of electrode layers, a metal layer, a barrier metal layer covering the metal layer, and a second block insulation film covering the barrier metal layer are formed; and the barrier layer is formed at an interface between the first block insulation film and the second block insulation film.

The above manufacturing method may be configured such that the barrier layer is formed at an interface between the first block insulation film and the charge storage film.

The above manufacturing method may be configured such that the barrier layer is formed at an interface between the charge storage film and the tunnel insulation film.

The above manufacturing method may be configured such that a first film facing the charge storage film and a second film facing the channel film, oxygen concentration of which is greater than that of the first film are formed in the tunnel insulation film, and the barrier layer is formed at an interface between the first film and the second film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a semiconductor substrate;
a laminated body formed by laminating a plurality of electrode layers on the semiconductor substrate;
a memory film provided in the laminated body and including a first block insulation film disposed in a direction perpendicular to the electrode layers, a charge storage film facing the first block insulation film, a tunnel insulation film facing the charge storage film, and a channel film facing the tunnel insulation film; and
a barrier layer provided an interface in the memory film and mainly composed of carbon, wherein
the charge storage film includes a first silicon nitride layer facing the first block insulation film, a silicon oxynitride layer facing the first silicon nitride layer, and a second silicon nitride layer facing the silicon oxynitride layer, and
each of the plurality of electrode layers includes a metal layer, a barrier metal layer that covers the metal layer, and second block insulation film that covers the harrier metal layer, and a carbon concentration of the barrier layer is within the range of 0.1 to 10.0 atomic, and the barrier layer has a thickness equal to or less than 0.5 nanometers, and the barrier layer is provided at interface between the second silicon nitride layer and the tunnel insulation film.

2. The semiconductor memory device according to claim 1, wherein
the barrier layer contains the carbon, silicon, and nitrogen.

3. The semiconductor memory device according to claim 2, wherein the silicon content of the first silicon nitride layer is less than the silicon content of the second silicon nitride layer.

4. The semiconductor memory device according to claim 2, wherein the silicon content of the first silicon nitride layer is greater than the silicon content of the second silicon nitride layer.

* * * * *